United States Patent
Fay et al.

(10) Patent No.: US 10,418,330 B2
(45) Date of Patent: Sep. 17, 2019

(54) SEMICONDUCTOR DEVICES AND METHODS OF MAKING SEMICONDUCTOR DEVICES

(71) Applicant: Micron Technology, Inc., Boise, ID (US)

(72) Inventors: Owen R. Fay, Meridian, ID (US); Steven R. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/253,504

(22) Filed: Apr. 15, 2014

(65) Prior Publication Data

US 2015/0294940 A1 Oct. 15, 2015

(51) Int. Cl.
| | |
|---|---|
| *H01L 23/538* | (2006.01) |
| *H01L 25/065* | (2006.01) |
| *H01L 25/00* | (2006.01) |
| *H01L 23/00* | (2006.01) |
| *H01L 23/31* | (2006.01) |

(52) U.S. Cl.
CPC ...... *H01L 23/5386* (2013.01); *H01L 23/3135* (2013.01); *H01L 23/3157* (2013.01); *H01L 24/48* (2013.01); *H01L 25/0657* (2013.01); *H01L 25/50* (2013.01); *H01L 24/45* (2013.01); *H01L 2224/05599* (2013.01); *H01L 2224/16145* (2013.01); *H01L 2224/32145* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/73265* (2013.01); *H01L 2224/8592* (2013.01); *H01L 2224/85399* (2013.01); *H01L 2225/0651* (2013.01); *H01L 2225/06527* (2013.01); *H01L 2225/06582* (2013.01);
(Continued)

(58) Field of Classification Search
None
See application file for complete search history.

(56) References Cited

U.S. PATENT DOCUMENTS 5,780,923 A * 7/1998 Courtenay ................. 257/666
5,847,445 A * 12/1998 Wark ..................... H01L 23/16
257/669

(Continued)

*Primary Examiner* — Samuel A Gebremariam
*Assistant Examiner* — Jonas T Beardsley
(74) *Attorney, Agent, or Firm* — TraskBritt

(57) ABSTRACT

Semiconductor devices may include a substrate and a semiconductor die on the substrate. The semiconductor die may include an active surface and a lateral edge at a periphery of the active surface. An electrically insulating material may be located on the active surface proximate the lateral edge. The electrically insulating material may be distinct from any other material located on the active surface. A wire bond may extend from the active surface, over the electrically insulating material, to the substrate. Methods of making semiconductor devices may involve positioning an electrically insulating material on an active surface of a semiconductor die proximate a lateral edge at a periphery of an active surface. After positioning the electrically insulating material on the active surface, a wire bond extending from the active surface, over the electrically insulating material, to the substrate may be formed.

19 Claims, 6 Drawing Sheets

(52) U.S. Cl.
CPC ............ *H01L 2924/00014* (2013.01); *H01L 2924/15311* (2013.01); *H01L 2924/181* (2013.01)

(56) References Cited

U.S. PATENT DOCUMENTS

| | | | |
|---|---|---|---|
| 6,348,363 B1* | 2/2002 | Chung | H01L 23/3171 |
| | | | 257/E21.238 |
| 6,943,457 B2 | 9/2005 | Smith | |
| 8,435,836 B2 | 5/2013 | Fay et al. | |
| 8,618,659 B2 | 12/2013 | Sato et al. | |
| 8,680,660 B1* | 3/2014 | Law et al. | 257/676 |
| 2001/0050417 A1* | 12/2001 | Courtenay | 257/666 |
| 2003/0042615 A1* | 3/2003 | Jiang | H01L 24/32 |
| | | | 257/777 |
| 2004/0201088 A1* | 10/2004 | Kim | H01L 24/48 |
| | | | 257/686 |
| 2007/0194415 A1* | 8/2007 | Seng | H01L 25/0657 |
| | | | 257/678 |
| 2008/0150120 A1* | 6/2008 | Nishimura | H01L 21/6836 |
| | | | 257/690 |
| 2009/0243051 A1 | 10/2009 | Vanam et al. | |
| 2012/0153444 A1* | 6/2012 | Haga et al. | 257/666 |
| 2012/0155049 A1 | 6/2012 | Haba et al. | |
| 2013/0119528 A1* | 5/2013 | Groothuis et al. | 257/690 |

\* cited by examiner

SEMICONDUCTOR DEVICES AND METHODS OF MAKING SEMICONDUCTOR DEVICES

FIELD

This disclosure relates generally to semiconductor devices and methods of making semiconductor devices. More specifically, disclosed embodiments relate to semiconductor devices and methods of making semiconductor devices including wire bonds exhibiting a reduced likelihood of shorting to other wire bonds or to a semiconductor die or other substrate of the semiconductor device.

BACKGROUND

One technique for electrically connecting a semiconductor die to a supporting substrate, such as an interposer, is to use a wire bond. One end of the wire bond may be attached to a bond pad of the semiconductor die, the wire bond may extend from the semiconductor die to the substrate, and another end of the wire bond may be attached to a terminal pad of the substrate. Because semiconductor devices may require many electrical connections between the semiconductor die and the substrate, many wire bonds may extend from various locations on the semiconductor die to corresponding locations on the substrate. As the size of semiconductor devices decreases and their complexity increases, the size (e.g., diameter) of individual wire bonds may decrease and the wire bonds may be positioned closer to one another. Moreover, some semiconductor die configurations (e.g., those having bond pads not located at peripheries of the dice) may require long wire bonds to bridge the space between the bond pads of the die and the bond pads of the substrate. However, conventional wire bonds are somewhat limited in length, to about 2 mm. It would be desirable to substantially extend the practical length of wire bonds to, for example, 5 mm, particularly when bond pads are placed in a central region of a semiconductor die, or other location remote from the die periphery.

Frequently, the wire bonds and semiconductor die are encapsulated in another material to protect them from environmental contaminants and to fix their locations relative to one another within a semiconductor device package. For example, a polymer encapsulant material may flow over and around the wire bonds and semiconductor die and be cured. The progressing encapsulant material may, however, displace or even deform the wire bonds in a phenomenon termed "wire bond sweep," which may cause the wire bonds to contact one another or to contact an active surface of the semiconductor die. These contacts (i.e., "shorts") may cause the semiconductor device to malfunction or fail. As may be appreciated by one of ordinary skill in the art, the propensity toward wire bond sweep increases as wire bond length increases.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device or component thereof, but are merely idealized representations employed to describe illustrative embodiments. Thus, the drawings are not necessarily to scale.

Disclosed embodiments relate generally to semiconductor devices and methods of making semiconductor devices including wire bonds exhibiting a reduced likelihood of shorting to the semiconductor device. More specifically, disclosed are embodiments of semiconductor devices including an electrically insulating material located, oriented, and configured to reduce the likelihood that wire bonds will short to an active surface of a semiconductor die.

Figure 1:
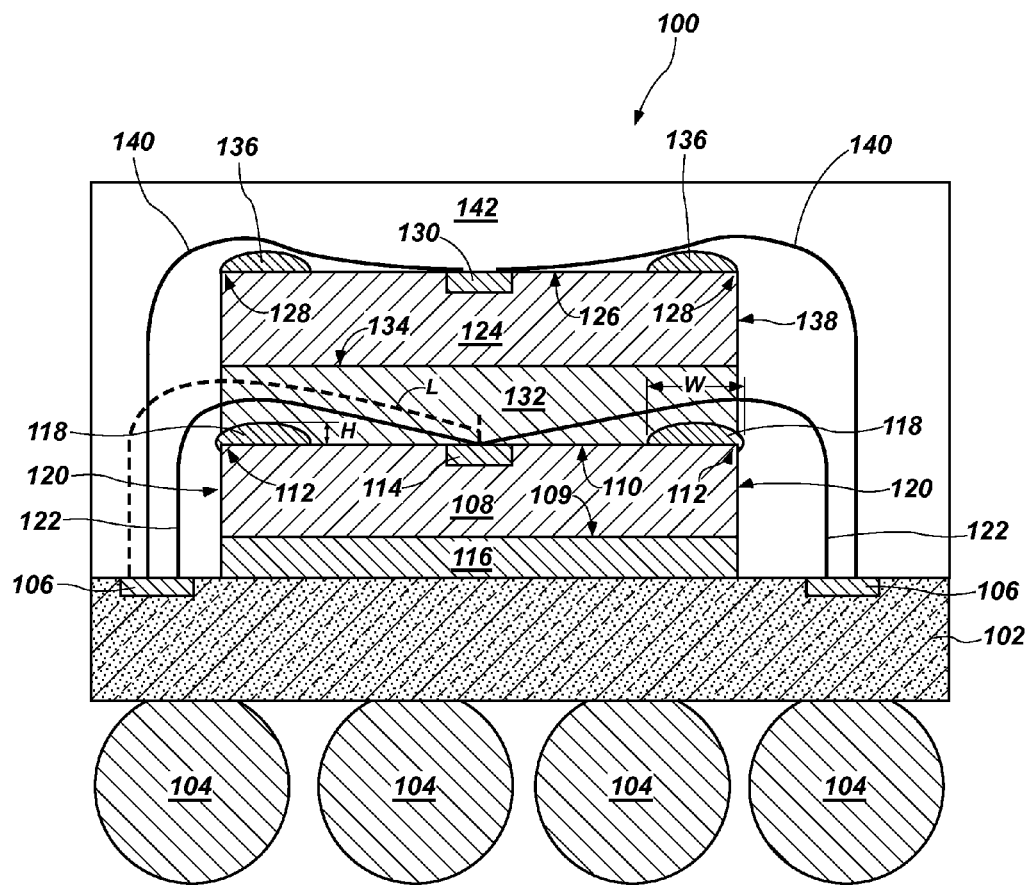
FIG. 1 is a cross-sectional view of an embodiment of a semiconductor device within the scope of this disclosure.

Referring to FIG. 1, a cross-sectional view of an embodiment of a semiconductor device 100 is shown. The semiconductor device 100 may include a substrate 102, which may be configured to electrically connect the semiconductor device 100 to other components, such as higher-level packaging. For example, the substrate 102 may include conductive bumps 104 (e.g., solder balls) configured to electrically connect the semiconductor device 100 to another component (e.g., by reflowing the material of the conductive bumps 104). The substrate 102 may further include terminal pads 106 on a side of the substrate 102 opposing the conductive bumps 104. For example, the substrate 102 may include a plurality of terminal pads 106 distributed around a periphery of the substrate in a predetermined arrangement (see FIG. 4), the substrate 102 including internal circuitry connecting the terminal pads 106 to the conductive bumps 104.

The semiconductor device 100 may include a first semiconductor die 108 located on, and affixed to, the substrate 102 by a back side surface 109 thereof. The first semiconductor die 108 may include an active surface 110 having lateral edges 112 at opposing sides of a periphery of the active surface 110. The active surface 110 may include integrated circuitry enabling desired functions (e.g., memory, logic, or processing) of the first semiconductor die 108. The active surface 110 may be located on a side of the first semiconductor die 108 opposing the substrate 102. The first semiconductor die 108 may include bond pads 114 on the active surface 110 of the first semiconductor die 108. The bond pads 114 may be electrically connected to integrated circuitry of the active surface 110 of the first semiconductor die 108. In some embodiments, the bond pads 114 may be distant from one or both of the lateral edges 112 of the active surface 110. For example, the bond pads 114 may be located in one or more rows proximate a central portion of the active surface 110. As a specific, nonlimiting example, lines of symmetry of the bond pads 114 may be at least substantially aligned with a line of symmetry of the active surface 110 between the lateral edges 112. The first semiconductor die 108 may be physically secured to the substrate 102. For example, a die attach film 116 may be located between, and bonded to each of, the first semiconductor die 108 and the substrate 102.

A first electrically insulating material 118 may be located on the active surface 110 of the first semiconductor die 108 proximate one or both of the lateral edges 112. The first electrically insulating material 118 may be distinct from any other material located on the active surface 110 of the first semiconductor die 108. For example, a boundary may be located between the first electrically insulating material 118 and any other material, such as active surface passivation, in contact with the first electrically insulating material 118. The first electrically insulating material 118 may extend to the lateral edge 112 of the first semiconductor die 108 in some embodiments. For example, the first electrically insulating material 118 may extend beyond the lateral edge 112 of the first semiconductor die 108, as shown in FIG. 1. More specifically, the first electrically insulating material 118 may embed the lateral edge 112 of the first semiconductor die 108 within the first electrically insulating material 118, such that a portion of the first electrically insulating material 118 is in contact with the active surface 110 of the first semiconductor die 108 and another portion of the first electrically insulating material 118 is in contact with a side surface 120 of the first semiconductor die 108.

A width W of the first electrically insulating material 118 as measured in a direction perpendicular to an adjacent lateral edge 112 may be, for example, about 20 µm or greater, and a height H of the first electrically insulating material 118 as measured in a direction perpendicular to the active surface 110 may be, for example, about 50 µm or less. More specifically, the width W of the first electrically insulating material 118 may be, for example, about 50 µm or greater, and the height H of the first electrically insulating material 118 may be, for example, about 37.5 µm or less. As a specific, nonlimiting example, the width W of the first electrically insulating material 118 may be about 100 µm or greater, and the height H of the first electrically insulating material 118 may be about 25 µm or less.

In some embodiments, the first electrically insulating material 118 may be an epoxy material. Epoxy materials used as the first electrically insulating material 118 may exhibit a high viscosity (e.g., may not flow using capillary action to drive movement) to enable their placement proximate the lateral edge 112 of the active surface 110 without significantly flowing down the side surface 120 (e.g., without covering the side surface 120) of the first semiconductor die 108. For example, a viscosity of an epoxy material for use as the first electrically insulating material 118 before curing may be greater than a viscosity of any other material located on the active surface of the semiconductor die before any curing. As a specific, nonlimiting example, an epoxy material suitable for use as the first electrically insulating material 118 may be a dam material (e.g., FP4451TD, commercially available from Henkel Consumer Goods Inc. of Scottsdale, Ariz.). Other suitable materials compatible with passivation and underfill materials may be employed, such as, for example, a silicone material, an acrylic material (e.g., an acrylic resin), a nonconductive polymer material (e.g., polyimide or polybenzoxazole), or a nonconductive paste.

First wire bonds 122 may extend from the active surface 110, over the first electrically insulating material 118 on a side of the first electrically insulating material 118 opposing the first semiconductor die 108, to the substrate 102. More specifically, the first wire bonds 122 may be physically bonded and electrically connected to the bond pads 114 on the active surface 110 of the first semiconductor die 108; may extend from the bond pads 114, over the first electrically insulating material 118, beyond the lateral edges 112; and may be physically bonded and electrically connected to the terminal pads 106 of the substrate 102. The first wire bonds 122 may be uninsulated (i.e., may lack any electrically insulating material coating on an exterior surface of the electrically conductive material of the first wire bonds 122), as is conventional. The first electrically insulating material 118 may be located, oriented, and configured to reduce (e.g., eliminate) the likelihood that laterally adjacent first wire bonds 122 will contact one another and that any first wire bond 122 will contact the active surface 110 of the first semiconductor die 108 (e.g., at the lateral edge 112).

The first wire bonds 122 may be long distance wire bonds. For example, the first wire bonds 122 may extend from a central portion of the active surface 110, over the first electrically insulating material 118, and beyond the lateral edges 112 of the first semiconductor die 108, to the substrate 102. More specifically, a length L of a first wire bond 122 may be, for example, greater than 2.5 mm. As a specific, nonlimiting example, the length L of the first wire bond 122 may be greater than 5 mm. A material of the first wire bonds 122 may be, for example, gold, silver, copper, aluminum, or an alloy of any of these metals, as is conventional.

In some embodiments, the semiconductor device 100 may include a second semiconductor die 124 located over the first semiconductor die 108, such that the first electrically insulating material 118 is located between the first semiconductor die 108 and the second semiconductor die 124. The second semiconductor die 124 may include a second active surface 126 and second lateral edges 128 at opposing sides of a periphery of the second active surface 126. The second active surface 126 may include integrated circuitry and enabling desired functions (e.g., memory, logic, or processing) of the second semiconductor die 124. The second active surface 126 may be located on a side of the second semiconductor die 124 opposing the first semiconductor die 108. The second semiconductor die 124 may include bond pads 130 on the second active surface 126 of the second semiconductor die 124. The bond pads 130 may be electrically connected to circuitry of the second active surface 126 of the second semiconductor die 124. In some embodiments, the bond pads 130 may be distant from one or both of the second lateral edges 128 of the second active surface 126. For example, the bond pads 130 may be located proximate a central portion of the second active surface 126. As a specific, nonlimiting example, lines of symmetry of the bond pads 130 may be at least substantially aligned with a line of symmetry of the second active surface 126 between the second lateral edges 128.

The second semiconductor die 124 may be physically secured to the first semiconductor die 108. For example, a film-over-wire material 132 may be located between the first semiconductor die 108 and the second semiconductor die 124. More specifically, the film-over-wire material 132 may contact and be bonded to a portion of the active surface 110 of the first semiconductor die 108 and at least a portion of a back side surface 134 of the second semiconductor die 124 to secure the first semiconductor die 108 to the second semiconductor die 124. The first wire bonds 122 may be at least partially embedded in the film-over-wire material 132. For example, the portions of the first wire bonds 122 located between the lateral edges 112 of the first semiconductor die 108 may be entirely encapsulated within the film-over-wire material 132. The film-over-wire material 132 may be in contact with the first electrically insulating material 118, and a boundary between the film-over-wire material 132 and the first electrically insulating material 118 may be discernible, such that the first electrically insulating material 118 may be distinct from the film-over-wire material 132. The film-over-wire material 132 may exhibit a lower viscosity before any curing than a viscosity of the first electrically insulating material 118 before curing.

A second electrically insulating material 136 may be located on the second active surface 126 of the second semiconductor die 124 proximate one or both of the second lateral edges 128. The second electrically insulating material 136 may be distinct from any other material located, such as passivation material, on the second active surface 126 of the second semiconductor die 124. For example, a recognizable boundary may be located between the second electrically insulating material 136 and any other material in contact with the second electrically insulating material 136. The second electrically insulating material 136 may extend to the second lateral edge 128 of the first semiconductor die 108 in some embodiments. For example, the second electrically insulating material 136 may extend beyond the second lateral edge 128 of the second semiconductor die 124, as shown in FIG. 1. More specifically, the second electrically insulating material 136 may embed the second lateral edge 128 of the second semiconductor die 124 within the second electrically insulating material 136, such that a portion of the second electrically insulating material 136 is in contact with the second active surface 126 of the second semiconductor die 124 and another portion of the second electrically insulating material 136 is in contact with a side surface 138 of the second semiconductor die 124.

The second electrically insulating material 136 may be at least substantially similar to the first electrically insulating material 118 in terms of size, location, orientation, configuration, and material composition. For example, the second electrically insulating material 136 may be of the same sizes and of the same materials discussed previously in connection with the first electrically insulating material 118. In some embodiments, the second electrically insulating material 136 may be the same size, the same material, or both the same size and the same material as the first electrically insulating material 118. In other embodiments, the second electrically insulating material 136 may be a different size, a different material, or both a different size and a different material from the first electrically insulating material 118.

Second wire bonds 140 may extend from the second active surface 126, over the second electrically insulating material 136 on a side of the second electrically insulating material 136 opposing the second semiconductor die 124, to the substrate 102. More specifically, the second wire bonds 140 may be physically bonded and electrically connected to the bond pads 130 on the second active surface 126 of the second semiconductor die 124; may extend from the bond pads 130, over the second electrically insulating material 136, beyond the second lateral edges 128; and may be physically bonded and electrically connected to the terminal pads 106 of the substrate 102. As is conventional, the second wire bonds 140 may be uninsulated (i.e., may lack any electrically insulating material coating on an exterior surface of the electrically conductive material of the second wire bonds 140). The second electrically insulating material 136 may be located, oriented, and configured to reduce (e.g., eliminate) the likelihood that adjacent second wire bonds 140 will contact one another and that any second wire bond 140 will contact the second active surface 126 of the second semiconductor die 124 (e.g., at the second lateral edge 128).

The second wire bonds 140 may be long distance wire bonds. For example, the second wire bonds 140 may extend from a central portion of the second active surface 126, over the second electrically insulating material 136, beyond the second lateral edges 128 of the second semiconductor die 124, to the substrate 102. Specific lengths of the second wire bonds 140 may be, for example, greater than the values described previously in connection with the length L of the first wire bonds 122, exhibiting a similar lateral extent but a greater vertical extent to reach terminal pads 106 on substrate 102. A material of the second wire bonds 140 may be, for example, gold, silver, copper, aluminum, or an alloy of any of these metals.

In some embodiments, the semiconductor device 100 may further include one or more additional semiconductor dice, similar to the second semiconductor die 124, stacked over the second semiconductor die 124 and electrically connected to the substrate 102.

A dielectric encapsulation material 142 may be located over the substrate 102, such that the first semiconductor die 108 and the second semiconductor die 124 are at least partially embedded in the encapsulation material 142. The second wire bonds 140 may be embedded in the encapsulation material 142, and the encapsulation material 142 may contact a portion of the second active surface 126 of the second semiconductor die 124. Portions of the first wire bonds 122 extending beyond the lateral edges 112 of the first semiconductor die 108 may be embedded within the encapsulation material 142. The encapsulation material 142 may be in contact with the second electrically insulating material 136, and a boundary between the encapsulation material 142 and the second electrically insulating material 136 may be discernible, such that the second electrically insulating material 136 may be distinct from the encapsulation material 142. The encapsulation material 142 may exhibit a lower viscosity before any curing than a viscosity of the second electrically insulating material 136 before curing.

As a specific, nonlimiting example, a semiconductor device within the scope of this disclosure may include a substrate. A semiconductor die may be located on the substrate and may include an active surface extending to a lateral edge at a periphery of the active surface. The active surface may be located on a side of the semiconductor die opposing the substrate. An electrically insulating material may be located on the active surface of the semiconductor die proximate at least a portion of the lateral edge. The electrically insulating material may be distinct from any other material located on the active surface of the semiconductor die. A wire bond may extend from the active surface, over the electrically insulating material (e.g., on a side of the electrically insulating material opposing the semiconductor die), to the substrate.

When fabricating the semiconductor device 100, the first semiconductor die 108 may be positioned on the substrate 102 with the active surface 110 of the first semiconductor die 108 located on a side of the first semiconductor die 108 opposing the substrate 102. The first electrically insulating material 118 may be positioned on the active surface 110 of the first semiconductor die 108, such that the first electrically insulating material 118 is located proximate, and extends at least substantially parallel to, the lateral edge 112 at the periphery of the active surface 110. For example, an epoxy material may be dispensed on the active surface 110 of the first semiconductor die 108 proximate the lateral edge 112 and, in some embodiments, cured to form the first electrically insulating material 118. In some embodiments, the first electrically insulating material 118 may be positioned on the active surface 110 of the first semiconductor die 108 before any first wire bonds 122 are formed. In such embodiments, a first wire bond 122 extending from the active surface 110, over the first electrically insulating material 118 on a side of the first electrically insulating material 118 opposing the first semiconductor die 108, to the substrate 102 may be formed after positioning the first electrically insulating material 118 on the active surface 110.

The second semiconductor die 124 may be positioned over the first semiconductor die 108, such that the first electrically insulating material 118 is located between the first semiconductor die 108 and the second semiconductor die 124 with the second active surface 126 located on a side of the second semiconductor die 124 opposing the first semiconductor die 108. The second electrically insulating material 136 may be positioned on the second active surface 126 of the second semiconductor die 124, such that the second electrically insulating material 136 is located proximate, and extends at least substantially parallel to, the second lateral edge 128 at the periphery of the second active surface 126. For example, an epoxy material may be dispensed on the second active surface 126 of the second semiconductor die 124 proximate the second lateral edge 128 and, in some embodiments, cured to form the second electrically insulating material 136. In some embodiments, the second electrically insulating material 136 may be positioned on the second active surface 126 of the second semiconductor die 124 before any second wire bonds 140 are formed. In such embodiments, a second wire bond 140 extending from the second active surface 126, over the second electrically insulating material 136 on a side of the second electrically insulating material 136 opposing the second semiconductor die 124, to the substrate 102 may be formed after positioning the second electrically insulating material 136 on the second active surface 126.

As a specific, nonlimiting example, a method of making a semiconductor device within the scope of this disclosure may involve positioning a semiconductor die on a substrate with an active surface of the semiconductor die facing away from the substrate. An electrically insulating material may be positioned on the active surface of the semiconductor die proximate a lateral edge at a periphery of the active surface. After positioning the electrically insulating material on the active surface, a wire bond extending from the active surface, over the electrically insulating material on a side of the electrically insulating material opposing the semiconductor die, to the substrate may be formed.

Figure 2:
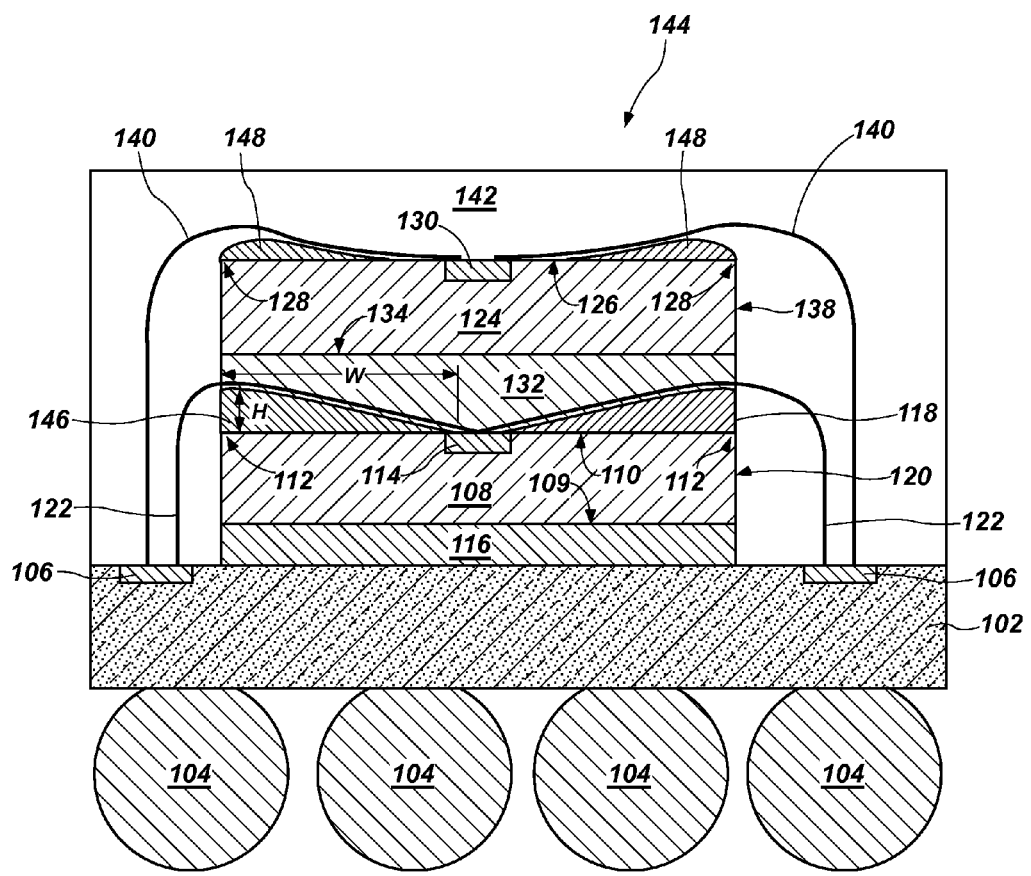
FIG. 2 is a cross-sectional view of another embodiment of a semiconductor device encompassed by this disclosure.

Referring to FIG. 2, a cross-sectional view of another embodiment of a semiconductor device 144 is shown. The semiconductor device 144 may be at least substantially similar to the semiconductor device 100 described previously in connection with FIG. 1, with exceptions discussed in greater detail below. In some embodiments, such as that shown FIG. 2, the first electrically insulating material 146 located on the active surface 110 of the first semiconductor die 108 may be a capillary underfill material. For example, the first electrically insulating material 146 may be formulated to flow over the active surface 110 and, in some embodiments, under the first wire bonds 122 using capillary action to position the first electrically insulating material 146 proximate the lateral edge 112 at the periphery of the active surface 110. As a specific, nonlimiting example, the capillary underfill material of the first electrically insulating material 146 may be U8410-73C, which is commercially available from Namics Corp. of Niigata-shi, Japan. The first electrically insulating material 146 may extend from the lateral edge 112 of the first semiconductor die 108 to proximate a central portion of the active surface 110 in some embodiments. For example, the first electrically insulating material 146 may extend from the lateral edge 112 of the first semiconductor die 108 to a location where first wire bonds 122 meet the active surface 110. More specifically, the first electrically insulating material 146 may cover and be in contact with an entire remaining portion of the active surface 110 after first wire bonds 122 have been fainted, including contacting the lateral edge 112 of the first semiconductor die 108, such that a portion of each first wire bond 122 is embedded within the first electrically insulating material 146.

A width W of the first electrically insulating material 146 may be, for example, about 50 μm or greater, and a height H of the first electrically insulating material 146 may be, for example, about 50 μm or less. More specifically, the width W of the first electrically insulating material 146 may be, for example, about 100 μm or greater, and the height H of the first electrically insulating material 146 may be, for example, about 37.5 μm or less. As a specific, nonlimiting example, the width W of the first electrically insulating material 146 may be about 200 μm or greater, and the height H of the first electrically insulating material 146 may be about 25 μm or less.

In some embodiments, the first electrically insulating material 146 may be positioned on the active surface 110 after the first wire bonds 122 have been formed. For example, capillary underfill material may be dispensed on the active surface 110 of the first semiconductor die 108 after the first wire bonds 122 have been formed. The capillary underfill material may flow, using capillary action, over an entire exposed area of the active surface 110 under the first wire bonds 122. The capillary underfill material may then be cured to form the first electrically insulating material 146.

In some embodiments, the second electrically insulating material 148 located on the second active surface 126 of the second semiconductor die 124 may be a capillary underfill material. For example, the second electrically insulating material 148 may be any of the materials, exhibit any of the material and dimensional characteristics, and be located in any of the positions described previously in connection with the first electrically insulating material 146, with the exception that the second electrically insulating material 148 is located on the second active surface 126 of the second semiconductor die 124. In some embodiments, the second electrically insulating material 148 may be the same volume, the same material, or both the same volume and the same material as the first electrically insulating material 146, each of the first electrically insulating material 146 and the second electrically insulating material 148 covering a similar area of an active surface and exhibiting a similar surface-tension-induced profile and adherence to respectively adjacent wire bonds 122 and 140. In other embodiments, the second electrically insulating material 148 may be of a different volume, a different material, or both a different volume and a different material from the first electrically insulating material 146.

In some embodiments, the second electrically insulating material 148 may be positioned on the second active surface 126 after the second wire bonds 140 have been formed. For example, capillary underfill material may be dispensed on the second active surface 126 of the first semiconductor die 108 after the second wire bonds 140 have been formed. The capillary underfill material may flow, using capillary action, over an entire exposed area of the second active surface 126 under the second wire bonds 140. The capillary underfill material may then be cured to form the second electrically insulating material 148.

Figure 3:
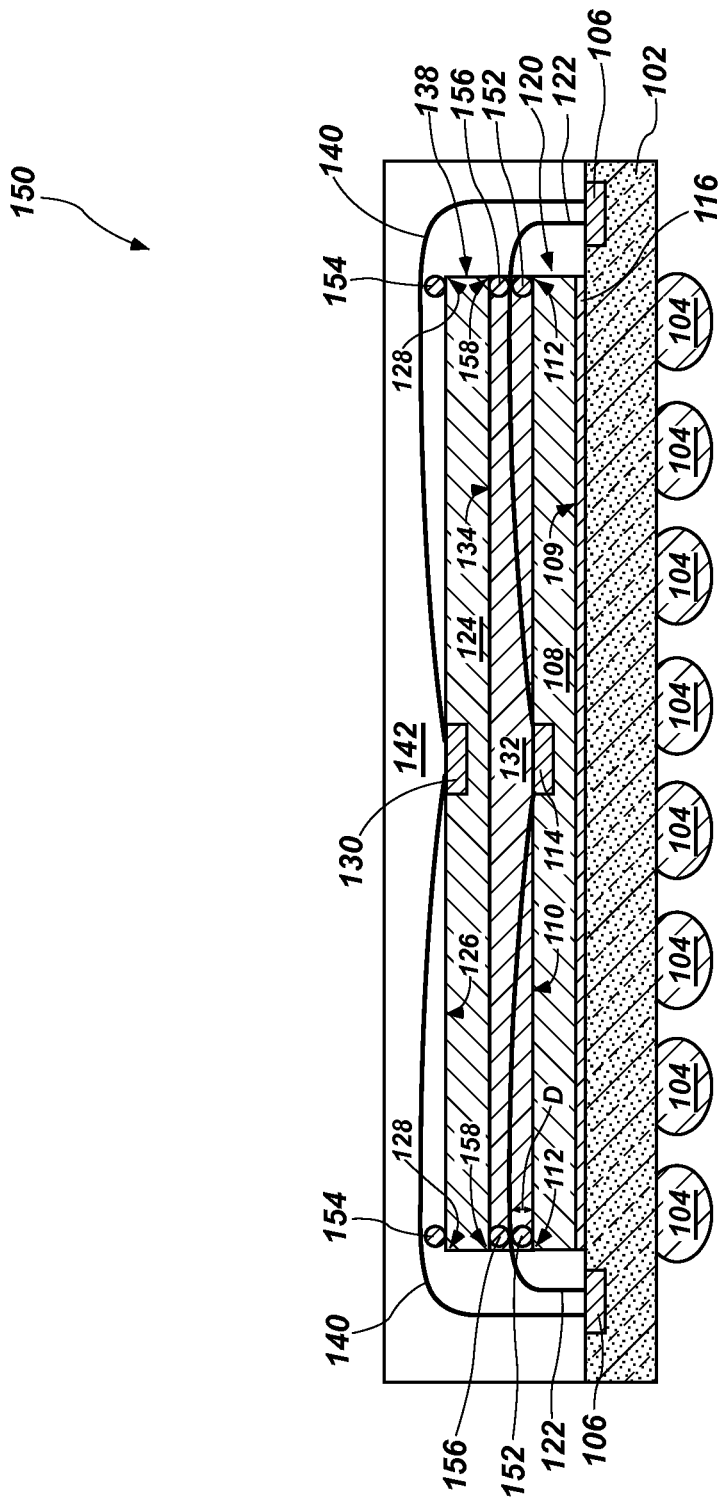
FIG. 3 is a cross-sectional view of yet another embodiment of a semiconductor device within the scope of this disclosure.

Referring to FIG. 3, a cross-sectional view of yet another embodiment of a semiconductor device 150 is shown. The semiconductor device 150 may be at least substantially similar to the semiconductor devices 100 and 144 described previously in connection with FIGS. 1 and 2, with exceptions discussed in greater detail below. In some embodiments, such as that shown FIG. 3, the first electrically insulating material 152 located on the active surface 110 of the first semiconductor die 108 may comprise an electrically insulating coating surrounding a wire. For example, the first electrically insulating material 152 may be a nanoscale, electrically insulating coating surrounding a conductive wire that may be otherwise similar to the first wire bonds 122. As a specific, nonlimiting example, the electrically insulating coating surrounding the wire of the first electrically insulating material 152 may be an X-WIRE®, which is commercially available from Microbonds, Inc. of Silicon Valley, Calif. A point of contact, tangential to an outer surface of the first electrically insulating material 152, between the first electrically insulating material 152 and the active surface 110 may be located, for example, within two diameters D of the first electrically insulating material 152 of the lateral edge 112, and the first electrically insulating material 152 may extend at least substantially parallel to the lateral edge 112. More specifically, the point of contact between the first electrically insulating material 152 and the active surface 110 may be located, for example, within one diameter D of the first electrically insulating material 152 of the lateral edge 112. As a specific, nonlimiting example, the point of contact between the first electrically insulating material 152 and the active surface 110 may be located within one-half of the diameter D of the first electrically insulating material 152 of the lateral edge 112.

The diameter D of the first electrically insulating material 152 may be, for example, about 50 µm or less. More specifically, the diameter D of the first electrically insulating material 152 may be, for example, about 25 µm or less. As a specific, nonlimiting example, the diameter D of the first electrically insulating material 152 may be about 20 µm or less.

In some embodiments, the second electrically insulating material 154 located on the second active surface 126 of the second semiconductor die 124 may be an electrically insulating coating surrounding a wire. For example, the second electrically insulating material 154 may be any of the materials, exhibit any of the material and dimensional characteristics, and be located in any of the positions described previously in connection with the first electrically insulating material 152, with the exception that the second electrically insulating material 154 is located on the second active surface 126 of the second semiconductor die 124. In some embodiments, the second electrically insulating material 154 may be the same size, the same material, or both the same size and the same material as the first electrically insulating material 152. In other embodiments, the second electrically insulating material 154 may be a different size, a different material, or both a different size and a different material from the first electrically insulating material 152.

In some embodiments, such as that shown in FIG. 3, a third electrically insulating material 156 may be located on the back side surface 134 of the second semiconductor die 124 proximate a third lateral edge 158 at a periphery of the back side surface 134 and oriented at least substantially parallel to the third lateral edge 158 and in at least substantial alignment with the first electrically insulating material 152 (e.g., a lateral extent of the third electrically insulating material 156 may overlap with a lateral extent of the first electrically insulating material 152). The third electrically insulating material 156 may be distinct from any other material located on the back side surface 134 of the second semiconductor die 124 and from the material of the second semiconductor die 124 itself. For example, a recognizable boundary may be located between the third electrically insulating material 156 and any other material in contact with the third electrically insulating material 156. More specifically, a recognizable boundary may be located between the third electrically insulating material 156 and any film-over-wire material 132, encapsulation material 142, and first wire bonds 122 in contact with the third electrically insulating material 156. The first wire bonds 122 may extend between, and be oriented at least substantially transverse to, the first electrically insulating material 152 and the third electrically insulating material 156. For example, the first wire bonds 122 may be contacted by each of the first electrically insulating material 152 and the third electrically insulating material 156 on opposing sides of the first wire bonds 122.

In some embodiments, the third electrically insulating material 156 may be an electrically insulating coating surrounding a wire. For example, the third electrically insulating material 156 may be any of the materials, exhibit any of the material and dimensional characteristics, and be located in any of the positions described previously in connection with the first electrically insulating material 152, with the exception that the third electrically insulating material 156 is located on the back side surface 134 of the second semiconductor die 124. In some embodiments, the third electrically insulating material 156 may be the same size, the same material, or both the same size and the same material as the first electrically insulating material 152, the second electrically insulating material 154, or both. In other embodiments, the third electrically insulating material 156 may be a different size, a different material, or both a different size and a different material from the first electrically insulating material 152, the second electrically insulating material 154, or both.

Figure 4:
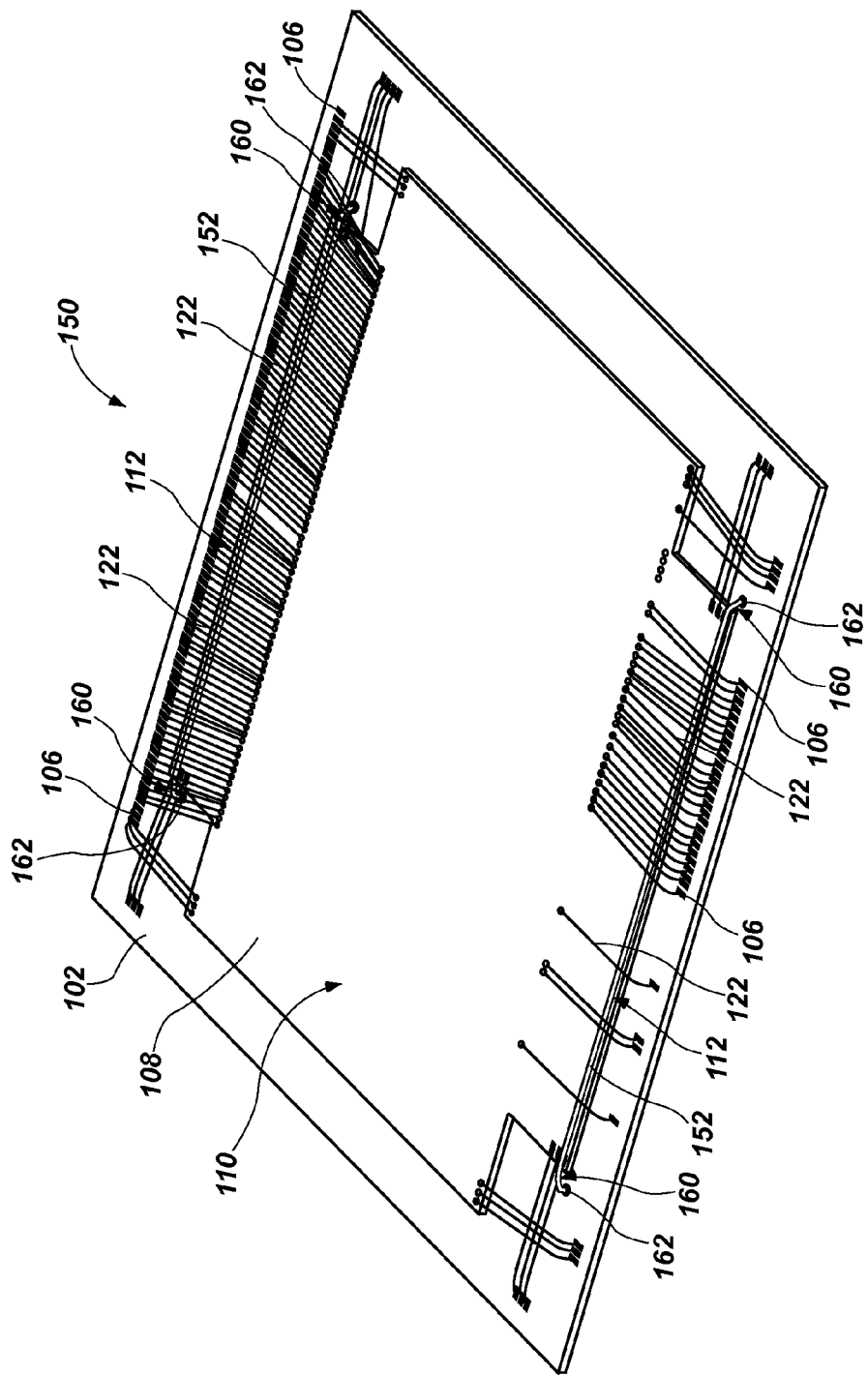
FIG. 4 is a perspective view of a portion of the semiconductor device of FIG. 3.

Referring to FIG. 4, a perspective view of the semiconductor device 150 of FIG. 3 is shown without any encapsulation material 142, the second semiconductor die 124 and its associated components, and the film-over-wire material 132. In some embodiments where the first electrically insulating material 152 is an electrically insulating coating surrounding a wire, both ends 160 of the wire may be bonded to the substrate 102, such that the wire extends from the substrate 102, between the active surface 110 of the first semiconductor die 108 and the first wire bonds 122, back to the substrate 102. For example, both ends 160 of the wire of the first electrically insulating material 152 may be physically bonded to a terminal pad 162 on the substrate 102, which terminal pad 162 may not be electrically connected to any other components, and the wire may extend up from the substrate 102 so that the electrically insulating coating surrounding the wire is in contact with the active surface 110. In other embodiments where the first electrically insulating material 152 is an electrically insulating coating surrounding a wire, both ends 160 of the wire may be bonded to the active surface 110 of the first semiconductor die 108 (e.g., by bonding the ends 160 to terminal pads not electrically connected to any other component on the active surface 110 of the first semiconductor die 108). In still other embodiments where the first electrically insulating material 152 is an electrically insulating coating surrounding a wire, one end 160 of the wire may be bonded to the active surface 110 of the first semiconductor die 108 and another end 160 of the wire may be bonded to the substrate 102.

In some embodiments, the first electrically insulating material 152 may be positioned on the active surface 110 before the first wire bonds 122 have been formed. For example, one end 160 of the first electrically insulating material 152 may be bonded to a terminal pad 162 on the substrate 102, the first electrically insulating material 152 may be formed to extend along the periphery of the active surface 110 of the first semiconductor die 108 proximate a lateral edge 112, and the other end 160 may be bonded to another terminal pad 162 on the substrate 102 before the first wire bonds 122 have been formed. Afterward, the first wire bonds 122 may be formed to extend from the active surface 110, over the first electrically insulating material 152, to the substrate 102, such that the first electrically insulating material 152 is located between the first wire bonds 122 and the first semiconductor die 108 proximate the lateral edge 112.

Returning to FIG. 3, ends of the second electrically insulating material 154 may be secured in embodiments where the second electrically insulating material 154 is an electrically insulating coating surrounding a wire using any of the configurations described previously in connection with the first electrically insulating material 152. In some embodiments, the second electrically insulating material 154 may be positioned on the second active surface 126 before the second wire bonds 140 have been formed. For example, one end of the second electrically insulating material 154 may be bonded to a terminal pad on the substrate 102, the second electrically insulating material 154 may be formed to extend along the periphery of the second active surface 126 of the second semiconductor die 124 proximate the second lateral edge 128, and the other end may be bonded to another terminal pad on the substrate 102 before the second wire bonds 140 have been formed. Afterward, the second wire bonds 140 may be formed to extend from the second active surface 126, over the second electrically insulating material 154, to the substrate 102, such that the second electrically insulating material 154 is located between the second wire bonds 140 and the second semiconductor die 124 proximate the second lateral edge 128.

Ends of the third electrically insulating material 156 may be secured in embodiments where the third electrically insulating material 156 is an electrically insulating coating surrounding a wire using any of the configurations described previously in connection with the first electrically insulating material 152. The third electrically insulating material 156 may be formed before the second semiconductor die 124 has been secured to the first semiconductor die 108. For example, one end of the third electrically insulating material 156 may be bonded to a terminal pad on the substrate 102, the third electrically insulating material 156 may be formed to extend over the first wire bonds 122 on a side of the first wire bonds 122 opposing the first substrate 102 such that the third electrically insulating material 156 is laterally proximate the first electrically insulating material 152, and the other end may be bonded to another terminal pad on the substrate 102 before the second semiconductor die 124 has been secured to the first semiconductor die 108. Afterward, the second semiconductor die 124 may be placed on a side of the third electrically insulating material 156 opposing the first semiconductor die 108; film-over-wire material 132 on the back side surface 134 of the second semiconductor die 124 may flow around the third electrically insulating material 156, the first wire bonds 122, and the first electrically insulating material 152 until the back side surface 134 is in contact with the third electrically insulating material 156; and the film-over-wire material 132 may be cured to secure the second semiconductor die 124 to the first semiconductor die 108. The third electrically insulating material 156 may, therefore, be configured to define a vertical standoff distance between the first semiconductor die 108 and the second semiconductor die 124 and may further be configured to stabilize the first semiconductor die 108 and the second semiconductor die 124 during positioning of the second electrically insulating material 154, formation of the second wire bonds 140, and encapsulation.

Figure 5:
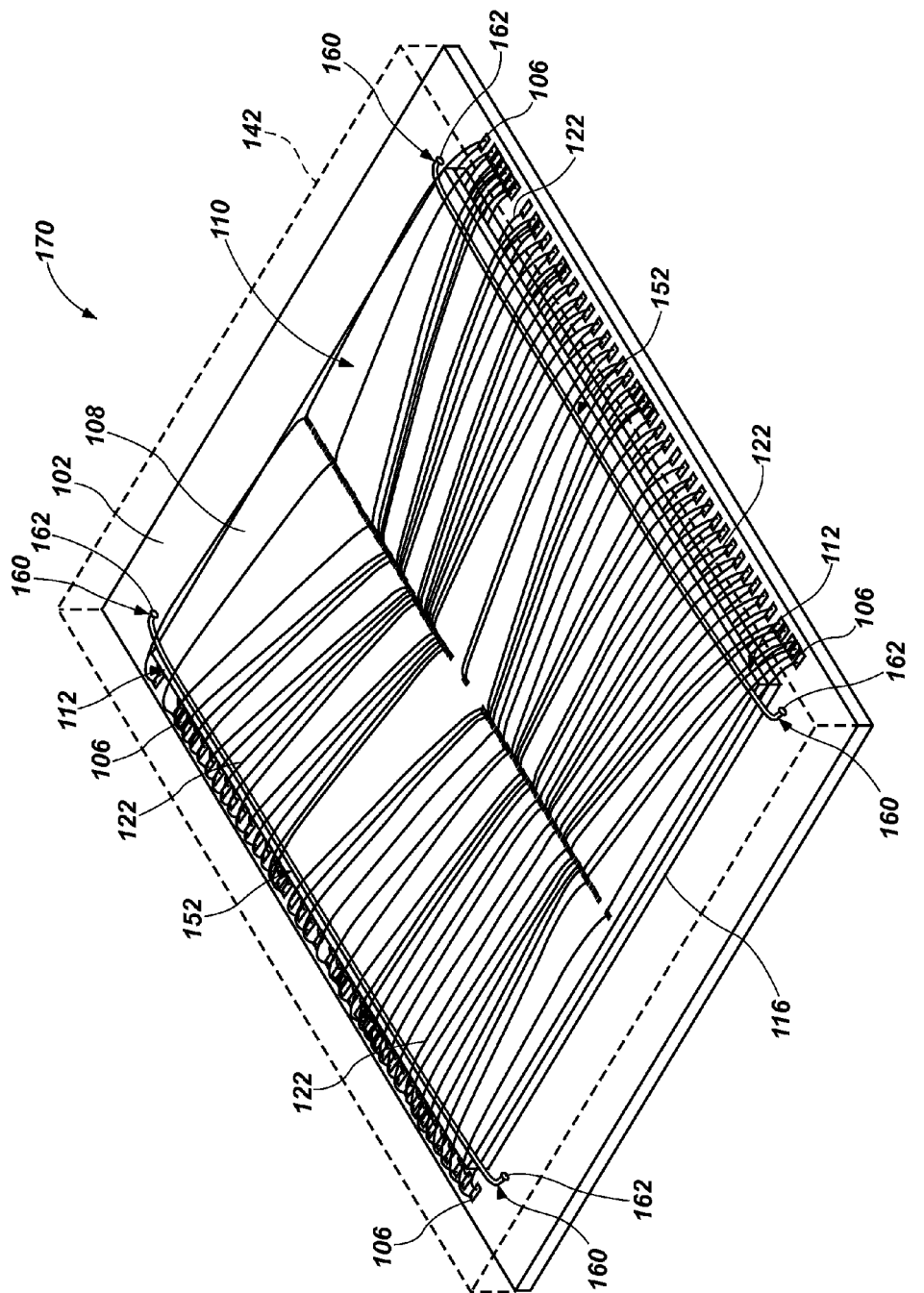
FIG. 5 is a perspective view of another embodiment of a semiconductor device.

FIG. 5 is a perspective view of another embodiment of a semiconductor device 170 with encapsulation material 142 shown in dashed lines. In some embodiments, the semiconductor device 170 may include only a single semiconductor die 108 (which may be analogous to the first semiconductor die 108 of FIGS. 1 through 4), and may lack the second semiconductor die 124, its associated components, and the film-over-wire material 132. The first electrically insulating material 152 may insulate the first wire bonds 122 from making electrical contact with the active surface 110 of the single semiconductor die 108 proximate the lateral edge 112. In some embodiments, such as that shown in FIG. 5, the first electrically insulating material 152 may be located between each first wire bond 122 electrically connected to the single semiconductor die 108 and the active surface 110 of the single semiconductor die 108 proximate the lateral edge 112.

Figure 6:
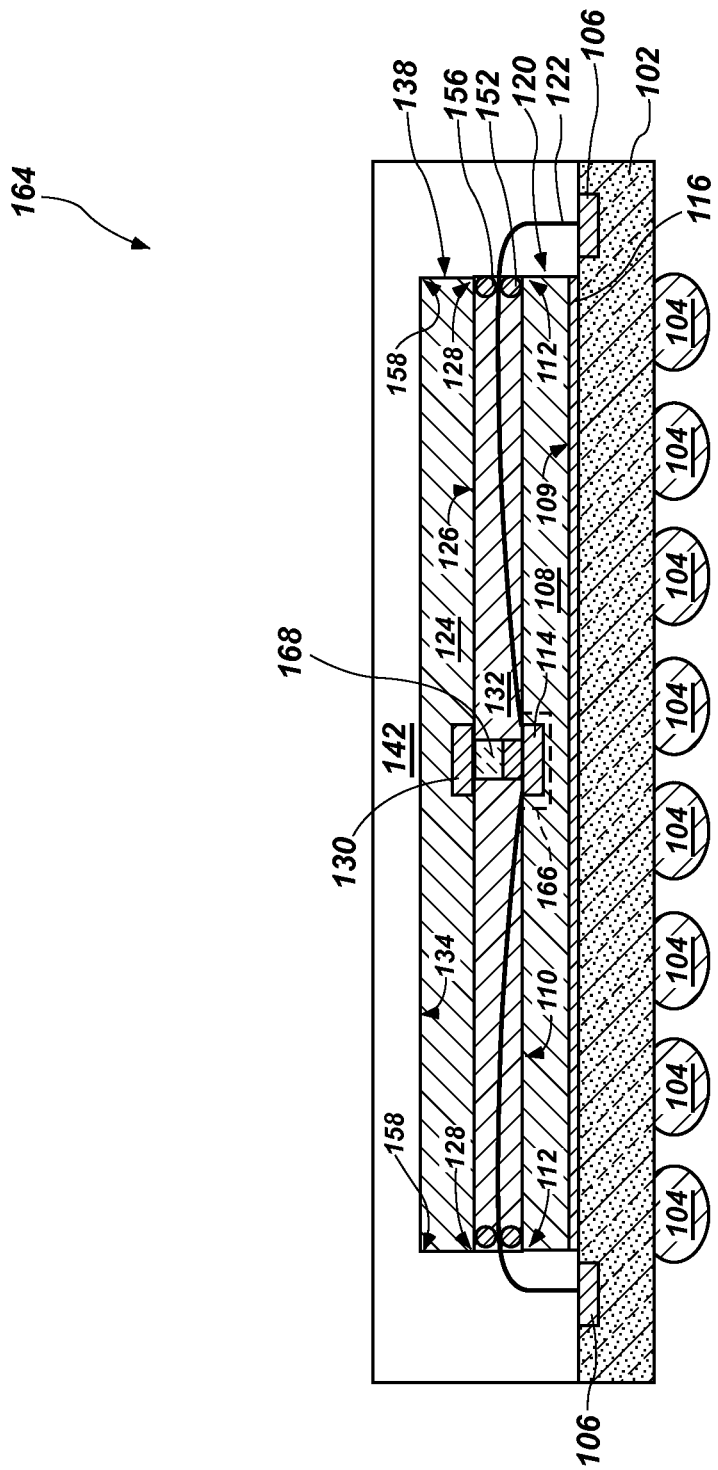
FIG. 6 is a cross-sectional view of still another embodiment of a semiconductor device encompassed by this disclosure.

Referring to FIG. 6, a cross-sectional view of still another embodiment of a semiconductor device 164 is shown. The semiconductor device 164 may be at least substantially similar to the semiconductor devices 100, 144, 150, and 170 described previously in connection with FIGS. 1 through 5, with exceptions discussed in greater detail below. In some embodiments, such as that shown FIG. 6, the second active surface 126 of the second semiconductor die 124 may not be located on the side of the second semiconductor die 124 opposing the first semiconductor die 108. For example, the second active surface 126 of the second semiconductor die 124 may be located on the same side of the second semiconductor die 124 as the first semiconductor die 108 (e.g., the second active surface 126 may face the first semiconductor die 108). Such an arrangement may be characterized as a "direct chip attach" (DCA) embodiment.

The bond pads 130 on the second active surface 126 of the second semiconductor die 124 may be electrically connected to, for example, bond pads 166, as shown in dashed lines, on the active surface 110 of the first semiconductor die 108, which may be separate from, or in contact with, the bond pads 114 on the active surface 110 of the first semiconductor die 108 that are electrically connected to the terminal pads 106 of the substrate 102. For example, an electrically conductive structure 168 may extend between, and be electrically connected to, each of the bond pads 130 on the second active surface 126 of the second semiconductor die 124 and the bond pads 166 on the active surface 110 of the first semiconductor die 108. The electrically conductive structure 168 may be, for example, a conductive pillar, a conductive bump, a conductive paste such as a conductive or conductor-filled epoxy, a solder material that is reflowed to form an electrical connection, or a Z-axis anisotropic conductive film.

The bond pads 166 of the first semiconductor die 108 to which the bond pads 130 of the second semiconductor die 124 are connected may be electrically connected to the bond pads 114 of the first semiconductor die 108 that are electrically connected to the substrate 102, for example, by integrated circuitry in the active surface 110 of the first semiconductor die 108. The first wire bonds 122 may be the only wire bonds in the semiconductor device 164 in some embodiments, and may electrically connect both the first semiconductor die 108 and the second semiconductor die 124 to the substrate 102. More specifically, the only wire bonds in the semiconductor device 164 may be the first wire bonds 122, and they may extend, for example, from the bond pads 114 on the active surface 110 of the first semiconductor die 108, between the first electrically insulating material 152 on the active surface 110 of the first semiconductor die 108 and the third electrically insulating material 156 (using like reference numerals to those employed in FIGS. 4 and 5 for clarity) on the second active surface 126 of the second semiconductor die 124, beyond the lateral edge 112 of the first semiconductor die 108, to the terminal pads 106 on the substrate 102.

While certain illustrative embodiments have been described in connection with the figures, those of ordinary skill in the art will recognize and appreciate that the scope of this disclosure is not limited to those embodiments explicitly shown and described herein. Rather, many additions, deletions, and modifications to the embodiments described herein may be made to produce embodiments within the scope of this disclosure, such as those hereinafter claimed, including legal equivalents. In addition, features from one disclosed embodiment may be combined with features of another disclosed embodiment while still being within the scope of this disclosure, as contemplated by the inventors.

What is claimed is:

1. A semiconductor device, comprising:
   a substrate;
   a semiconductor die located on the substrate and comprising an active surface extending to opposing lateral edges of the semiconductor die at a periphery of the active surface, the active surface including a central portion and outer portions between the central portion and the opposing lateral edges, the active surface having at least one row of bond pads thereon, the at least one row of bond pads located remote from the opposing lateral edges and only within the central portion of the active surface of the semiconductor die, the active surface being located on a side of the semiconductor die opposing the substrate;
   a first electrically insulating material located on the active surface of the semiconductor die, the first electrically insulating material in direct contact with each of the opposing lateral edges and extending over an entire remaining portion of the active surface from the opposing lateral edges at the periphery of the active surface laterally inwardly to and in direct contact with each individual bond pad of the at least one row of bond pads, the first electrically insulating material being distinct from any other material located on the active surface of the semiconductor die, wherein a height of the first electrically insulating material above the active surface increases at least substantially continuously from the at least one row of bond pads on the active surface of the semiconductor die to the opposing lateral edges; wire bonds extending from the at least one row of bond pads to the substrate, such that at least a portion of each individual wire bond of the wire bonds is embedded within an upper surface of the first electrically insulating material; and
   a second electrically insulating material, different than the first electrically insulating material, located over the wire bonds and the first electrically insulating material, the second electrically insulating material in direct contact with at least a portion of each individual bond pad of the at least one row of bond pads, such that at least another portion of each individual wire bond of the wire bonds is embedded within the second electrically insulating material.

2. The semiconductor device of claim 1, wherein a width of the first electrically insulating material is about 50 μm or greater and a maximum height of the first electrically insulating material is about 50 μm or less.

3. The semiconductor device of claim 1, wherein the first electrically insulating material comprises an epoxy material.

4. The semiconductor device of claim 3, wherein a viscosity of the first electrically insulating epoxy material before curing is greater than a viscosity of any other material located on the active surface of the semiconductor die before any curing.

5. The semiconductor device of claim 1, wherein the first electrically insulating material comprises a capillary underfill material.

6. The semiconductor device of claim 1, further comprising another semiconductor die located over the semiconductor die, the first and second electrically insulating materials being located between the semiconductor die and the other semiconductor die, the other semiconductor die comprising another active surface and another lateral edge at another periphery of the other active surface, the other active surface being located on another side of the other semiconductor die opposing the semiconductor die.

7. The semiconductor device of claim 6, wherein the second electrically insulating material comprises a film-over-wire material located between the semiconductor die and the other semiconductor die.

8. The semiconductor device of claim 6, further comprising a third electrically insulating material located on a back side surface of the other semiconductor die facing the semiconductor die, the third electrically insulating material being distinct from any other material located on the back side surface of the other semiconductor die, the wire bonds extending between the first electrically insulating material and the third electrically insulating material.

9. The semiconductor device of claim 6, further comprising:
   a third electrically insulating material located on the other active surface of the other semiconductor die proximate the other lateral edge, the third electrically insulating material being distinct from any other material located on the other active surface of the other semiconductor die; and
   additional wire bonds extending from the other active surface, over the third electrically insulating material on the other side of the third electrically insulating material opposing the other semiconductor die, to the substrate.

10. The semiconductor device of claim 9, further comprising an encapsulation material located over the substrate, the semiconductor die and the other semiconductor die being at least partially embedded in the encapsulation material, at least a portion of each of the wire bonds and the additional wire bonds being embedded in the encapsulation material, the encapsulation material contacting a portion of the other active surface of the other semiconductor die.

11. The semiconductor device of claim 1, further comprising another semiconductor die located over the semiconductor die, the first electrically insulating material being located between the semiconductor die and the other semiconductor die, the other semiconductor die comprising another active surface and another lateral edge at the other periphery of the other active surface, the other active surface of the other semiconductor die facing the active surface of the semiconductor die.

12. The semiconductor device of claim 11, wherein at least some bond pads on the active surface of the semiconductor die are electrically connected to at least some other bond pads on the other active surface of the other semiconductor die and further comprising additional wire bonds extending from the active surface of the semiconductor die, over the first electrically insulating material, to the substrate, at least one of the additional wire bonds electrically connecting the other semiconductor die to the substrate.

13. The semiconductor device of claim 1, wherein the at least one row of bond pads comprises a single row of bond pads located directly on the centerline of the semiconductor die.

14. A method of making a semiconductor device, comprising:
    positioning a semiconductor die on a substrate with an active surface of the semiconductor die facing away from the substrate, the active surface including a central portion and outer portions between the central portion and opposing lateral edges;
    forming wire bonds extending from bond pads of at least one row of bond pads on the active surface to the substrate, the at least one row of bond pads located remote from the opposing lateral edges of the active surface and only within the central portion of the active surface of the semiconductor die; and after forming the wire bonds, positioning a first electrically insulating material between the active surface of the semiconductor die and the wire bonds and embedding at least a portion of each individual wire bond of the wire bonds within an upper surface of the first electrically insulating material, the first electrically insulating material in direct contact with each of the opposing lateral edges and extending over an entire remaining portion of the active surface from the opposing lateral edges at a periphery of the active surface laterally inward to and in direct contact with each individual bond pad of the at least one row of bond pads, the first electrically insulating material being distinct from any other material located on the active surface of the semiconductor die, wherein a height of the first electrically insulating material above the active surface increases at least substantially continuously from the at least one row of bond pads on the active surface of the semiconductor die to the opposing lateral edges;
    after positioning the first electrically insulating material, positioning a second electrically insulating material, different than the first electrically insulating material, over the wire bonds and the first electrically insulating material and embedding at least another portion of each individual wire bond of the wire bonds within the second electrically insulating material, the second electrically insulating material in direct contact with at least a portion of each individual bond pad of the at least one row of bond pads.

15. The method of claim 14, wherein positioning the first electrically insulating material on the active surface of the semiconductor die comprises dispensing an epoxy material on the active surface of the semiconductor die.

16. The method of claim 14, further comprising positioning another semiconductor die over the semiconductor die, the first electrically insulating material being located between the semiconductor die and the other semiconductor die, the other semiconductor die comprising another active surface and another lateral edge at another periphery of the other active surface, the other active surface being located on another side of the other semiconductor die opposing the semiconductor die.

17. The method of claim 16, further comprising:
    positioning a third electrically insulating material on the other active surface of the other semiconductor die, the third electrically insulating material being located proximate the other lateral edge at the other periphery of the other active surface; and
    after positioning the third electrically insulating material on the other active surface, forming additional wire bonds extending from the other active surface, over the third electrically insulating material on the other side of the third electrically insulating material opposing the other semiconductor die, to the substrate.

18. The method of claim 14, further comprising positioning another semiconductor die over the semiconductor die, the first electrically insulating material being located between the semiconductor die and the other semiconductor die, the other semiconductor die comprising another active surface and another lateral edge at another periphery of the other active surface, the other active surface of the other semiconductor die facing the active surface of the semiconductor die.

19. The method of claim 18, further comprising:
    forming additional wire bonds extending from the active surface of the semiconductor die, over the first electrically insulating material, to the substrate; and
    electrically connecting at least some bond pads on the active surface of the semiconductor die to at least some other bond pads on the other active surface of the other semiconductor die, at least one of the additional wire bonds electrically connecting the other semiconductor die to the substrate.

* * * * *